United States Patent
Krishnan et al.

(10) Patent No.: US 9,640,423 B2
(45) Date of Patent: May 2, 2017

(54) INTEGRATED CIRCUITS AND METHODS FOR THEIR FABRICATION

(71) Applicant: GLOBALFOUNDRIES, Inc., Grand Cayman (KY)

(72) Inventors: Bharat Krishnan, Mechanicville, NY (US); Shishir Ray, Clifton Park, NY (US); Jinping Liu, Ballston Lake, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 14/813,254

(22) Filed: Jul. 30, 2015

(65) Prior Publication Data

US 2017/0033178 A1 Feb. 2, 2017

(51) Int. Cl.
| | |
|---|---|
| *H01L 21/763* | (2006.01) |
| *H01L 21/764* | (2006.01) |
| *H01L 29/06* | (2006.01) |
| *H01L 21/02* | (2006.01) |
| *H01L 21/768* | (2006.01) |
| *H01L 21/762* | (2006.01) |
| *H01L 29/78* | (2006.01) |
| *H01L 29/66* | (2006.01) |

(52) U.S. Cl.
CPC ...... *H01L 21/763* (2013.01); *H01L 21/02345* (2013.01); *H01L 21/02532* (2013.01); *H01L 21/02592* (2013.01); *H01L 21/02675* (2013.01); *H01L 21/764* (2013.01); *H01L 29/0649* (2013.01); *H01L 29/66545* (2013.01); *H01L 29/7851* (2013.01); *H01L 21/02164* (2013.01); *H01L 21/76224* (2013.01); *H01L 21/76882* (2013.01); *H01L 21/76883* (2013.01)

(58) Field of Classification Search
None
See application file for complete search history.

(56) References Cited

U.S. PATENT DOCUMENTS

| | | | | |
|---|---|---|---|---|
| 5,264,716 | A * | 11/1993 | Kenney | H01L 27/10829 |
| | | | | 257/301 |
| 5,707,466 | A * | 1/1998 | Atwater | H01L 21/32115 |
| | | | | 148/525 |
| 5,888,876 | A * | 3/1999 | Shiozawa | H01L 21/763 |
| | | | | 257/E21.396 |

(Continued)

OTHER PUBLICATIONS

Marmorstein et al. "A systematic study and optimization of parameters affecting grain size and surface roughness in excimer laser annealed polysilicon thin films." J. Appl. Phys. 82 (9), 1997, pp. 4303-4309.*

(Continued)

*Primary Examiner* — Brett Feeney
*Assistant Examiner* — Erik T Peterson
(74) *Attorney, Agent, or Firm* — Lorenz & Kopf, LLP (57) ABSTRACT

Integrated circuits and methods for producing the same are provided. In accordance with one embodiment a method of producing an integrated circuit includes forming a trench defined by a first material. The trench is filled with a second material to produce a gap defined within the second material, where the second material is in a solid state. The second material is reflowed within the trench to reduce a volume of the gap, and the second material is then solidified within the trench.

18 Claims, 5 Drawing Sheets

(56) References Cited

U.S. PATENT DOCUMENTS

| | | | |
|---|---|---|---|
| 6,169,013 B1* | 1/2001 | Voutsas | G02F 1/13454 |
| | | | 257/E21.133 |
| 6,180,480 B1* | 1/2001 | Economikos | H01L 27/10861 |
| | | | 257/E21.396 |
| 6,180,871 B1* | 1/2001 | Campbell | H01L 31/068 |
| | | | 136/245 |
| 6,329,270 B1* | 12/2001 | Voutsas | G02F 1/13454 |
| | | | 257/E21.133 |
| 6,992,024 B2 | 1/2006 | Cui et al. | |
| 7,157,327 B2* | 1/2007 | Haupt | H01L 29/66181 |
| | | | 257/E21.133 |
| 7,456,116 B2 | 11/2008 | Ingle et al. | |
| 7,888,233 B1 | 2/2011 | Gauri et al. | |
| 8,026,151 B2 | 9/2011 | Ang | |
| 8,187,951 B1 | 5/2012 | Wang et al. | |
| 8,232,176 B2 | 7/2012 | Lubomirsky et al. | |
| 8,557,712 B1 | 10/2013 | Antonelli et al. | |
| 8,809,161 B2 | 8/2014 | Gauri et al. | |
| 2002/0171099 A1* | 11/2002 | Sato | H01L 21/30604 |
| | | | 257/301 |
| 2004/0048453 A1* | 3/2004 | Kang | C30B 29/06 |
| | | | 438/486 |
| 2005/0136684 A1 | 6/2005 | Mukai et al. | |
| 2005/0142701 A1* | 6/2005 | Yamaguchi | H01L 21/2026 |
| | | | 438/151 |
| 2012/0220140 A1* | 8/2012 | Kajiyama | H01L 21/02532 |
| | | | 438/795 |
| 2014/0349468 A1* | 11/2014 | Suzuki | H01L 21/02532 |
| | | | 438/479 |

OTHER PUBLICATIONS

Hatano, M. "Excimer Laser-Induced Melting and Resolidification Dynamics of Silicon Thin Films." Journal of the Korean Physical Society, vol. 39, 2001, pp. S419-S424.*

Trivedi et al. "Void-free filling of spin-on dielectric in 22nm wide ultrahigh aspect ratio Si trenches." J. Vac. Sci. Technol. B 27, 2009, pp. 3145-3148.*

Marmorstein et al. A systematic study and optimization of parameters affecting grain size and surface roughness in excimer laser annealed polysilicon thin films. J. Appl. Phys. 82, 1997, pp. 4303-4309.*

Baeri et al. Phase Transitions in Amorphous Si Produced by Rapid Heating. Phys. Rev. Lett., 45, 1980, pp. 2036-2040.*

Dvurechenskii et al. Diffusion of Impurities in Undercooled Melt of Pulse Heated Ion-Implanted Silicon. Phys. Stat. Sol., (a)84, 1984, pp. 171-177.*

Webber et al. Computer simulation of high speed melting of amorphous silicon. Appl. Phys. Lett., 43, 1983, pp. 669-671.*

* cited by examiner

INTEGRATED CIRCUITS AND METHODS FOR THEIR FABRICATION

TECHNICAL FIELD

The present invention generally relates to integrated circuits and to methods for their manufacture, and more particularly relates to integrated circuits with filled trenches having minimal gaps within the fill and methods for manufacturing such integrated circuits.

BACKGROUND

The size of integrated circuits is continually decreasing with advancements in fabrication technology, and the size of individual components of the integrated circuits are also decreasing. The results of some established manufacturing processes change when applied to components that are smaller than a break-point size. One common integrated circuit manufacturing step is to fill a trench with a fill material. In many cases, the fill material is deposited within the trench using a desublimation process, such as chemical vapor deposition or atomic layer deposition. As the size of the trench decreases below a break-point size, gaps tend to form within the fill material, perhaps due to the limited amount of space available for the fill material and the dynamics of material deposition within the trench. Very narrow gaps with high aspect ratios are particularly susceptible to gap formation in the fill material. The resulting gaps tend to be inconsistent in size and shape.

The gaps in the fill material may produce a variety of undesirable effects. For example a gap in a sacrificial component decreases the structural stability of that sacrificial component, so mechanical processes can damage adjacent features when the sacrificial component fails. Fin field effect transistors (FinFETS) may be formed with a sacrificial "dummy gate" overlying them, where the dummy gate fills the trench between adjacent fins of the FinFET. Dummy gates with gaps in the fill material are less structurally sound than dummy gates without gaps or with smaller gaps in the fill material, and some mechanical and chemical processing steps may produce breaks in dummy gates with gaps in the fill material, but not in dummy gates without gaps or with minimal gaps in the fill material. When a dummy gate breaks, it no longer structurally supports the adjacent fins, and sometimes the fins will also break during mechanical processes, such as chemical mechanical planarization. FinFETs with broken fins do not function properly. Furthermore, inconsistent gap size in a sacrificial component may increase or alter the etch rate, so one dummy gate may expose an underlying layer to more etchant than another. This variable etchant exposure may change the dimensions of the underlying layers in an inconsistent manner, which decreases the reliability or causes failure of the resulting integrated circuit. Gaps in a permanent component also tend to be inconsistent in volume and shape, so the performance of circuits with components having gaps is inconsistent. Inconsistent performance is undesirable and can lead to integrated circuit failure.

Accordingly, it is desirable to provide integrated circuits with filled trenches that have an absence of gaps or minimal gaps in the fill material, and methods for producing the same. In addition, it is desirable to provide integrated circuits with filled trenches free of gaps, where the trenches have narrow widths and high aspect ratios, and methods of manufacturing the same. Furthermore, other desirable features and characteristics of the present invention will become apparent from the subsequent detailed description and the appended claims, taken in conjunction with the accompanying drawings and the foregoing technical field and background.

BRIEF SUMMARY

Integrated circuits and methods for producing the same are provided. In accordance with one embodiment a method of producing an integrated circuit includes forming a trench defined by a first material. The trench is filled with a second material to produce a gap defined within the second material, where the second material is in a solid state. The second material is reflowed within the trench to reduce a volume of the gap, and the second material is then solidified within the trench.

In accordance with another embodiment a method of producing an integrated circuit includes forming a trench defined by a first material. A second material is formed within the trench, where the second material has a pre-melt second material morphology, and where the second material is in a solid state. The second material is melted and solidified within the trench, where the second material has a post-melt second material morphology different than the pre-melt second material morphology.

In accordance with yet another embodiment an integrated circuit includes a substrate. A trench is defined within the substrate, where the trench has a trench width of about 30 nanometers or less and a trench depth of about 90 nanometers or more. A shallow trench isolation structure is disposed within the trench, where the shallow trench isolation structure includes silicon dioxide. The silicon dioxide of the shallow trench isolation structure is continuous and is free of gaps.

BRIEF DESCRIPTION OF THE DRAWINGS

The various embodiments will hereinafter be described in conjunction with the following drawing figures, wherein like numerals denote like elements, and wherein.

DETAILED DESCRIPTION

The following detailed description is merely exemplary in nature and is not intended to limit the disclosure or the application and uses of the disclosed processes. Furthermore, there is no intention to be bound by any expressed or implied theory presented in the preceding technical field, background, brief summary or the following detailed description. Various steps in the design and composition of integrated circuits are well known and so, in the interest of brevity, many conventional steps will only be mentioned briefly herein or will be omitted entirely without providing the well-known process details. Further, it is noted that integrated circuits include a varying number of components and that single components or features shown in the illustrations may be representative of multiple components.

Many integrated circuits include trenches with narrow widths and high aspect ratios that are filled with a fill material using, e.g., a desublimation process. In accordance with the integrated circuits and methods described herein, gaps are generally formed within the fill material during the filling process, and the gaps are reduced in volume or filled by melting and reflowing the fill material. Referring to an exemplary embodiment illustrated in FIG. 1, an integrated circuit 10 includes a trench 12 having a trench width, indicated by reference number 14, and a trench depth, indicated by reference number 16. In some embodiments, the trench 12 is defined within a first material 30 that overlies a substrate 18, but in alternate embodiments the trench 12 may be formed in the substrate 18 (not illustrated) or through the substrate 18 to a buried oxide layer (not illustrated), such as in a silicon on insulator (SOI) substrate. In general, the trench 12 is open on one end, referred to herein as the trench opening, which is indicated by reference number 20. The trench opening 20 is referred to as being at the "top" end of the trench 12 even though it is understood that the integrated circuit 10 may be turned over or positioned in any way such that the "top" is not necessarily up in all embodiments or at all times. The trench also includes a trench bottom 22 and trench side surfaces 24.

Figure 1:
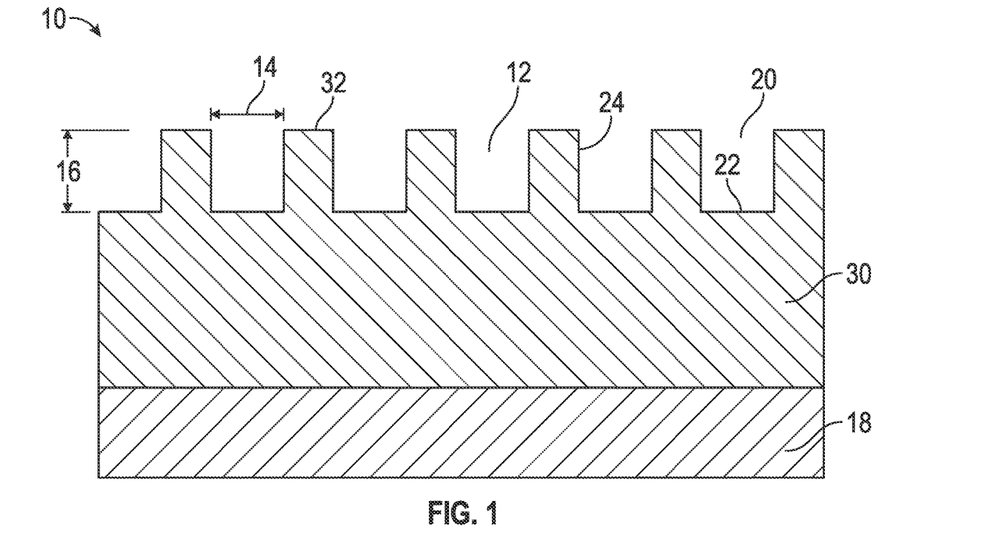
FIGS. 1-5 illustrate, in cross section, a portion of an integrated circuit and methods for its fabrication in accordance with exemplary embodiments.

The trench width 14 is measured at the trench opening 20 and extends from one trench side surface 24 to another opposite trench side surface 24, where the trench width 14 is measured directly across the trench opening 20. The trench opening 20 may be round in some embodiments, but it can also be a wide variety of other shapes. In embodiments with a round trench opening 20, the trench width 14 is the largest distance across the trench opening 20, but in embodiments with a rectangular trench opening 20 the trench width 14 is measured across the shorter side of the rectangular trench opening 20, as is generally understood for a width. For other shapes, such as oblongs, the trench width 14 is measured along the shortest dimension directly across the trench 12, so the trench width may be measured through a theoretical center point of the trench opening 20. The trench depth 16 is measured from the trench bottom 22 to the trench opening 20, and is generally the largest distance that can be measured from the trench bottom 20 to the trench opening 20. The trench 12 may include a back and front wall (not illustrated) in various embodiments.

The integrated circuit 10 includes a substrate 18, as mentioned above. As used herein, the term "substrate" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. Semiconductor material also includes other materials such as relatively pure and impurity-doped germanium, gallium arsenide, zinc oxide, glass, and the like. In an exemplary embodiment, the semiconductor material is a monocrystalline silicon substrate. The silicon substrate may be a bulk silicon wafer (as illustrated) or may be a thin layer of silicon on an insulating layer (commonly known as silicon-on-insulator or SOI, as mentioned above) that, in turn, is supported by a carrier wafer. The trench 12 may be formed in the substrate 18, but in some embodiments the trench 12 may be formed in other materials or layers overlying the substrate 18. The method described may be used for a wide variety of purposes, so many different embodiments are possible. This description will include two examples, but other processes are also possible. As used herein, the term "overlying" means "over" such that an intervening layer may lie between the layer including the trench 12 and the substrate 18, and "on" such that the layer including the trench 12 directly contacts the substrate 18.

In an exemplary embodiment illustrated in FIG. 1, the trench 12 is formed in a first material 30 overlying the substrate 18, such that the trench 12 is defined by the first material 30. In this first described example, the first material 30 is monocrystalline silicon that is epitaxially grown overlying the substrate 18, but many other embodiments for the first material 30 are also possible. The first material 30 may have a different concentration or type of conductivity imparting ions than the substrate 18 in some embodiments. The method described herein can be used for a wide variety of purposes, and the first material 30 is used as a general term for the material that defines the trench 12. For the sake of clarity, the first material 30 is shown as a separate layer overlying the substrate 18 to generally illustrate the integrated circuit 10 and method herein, but in some embodiments the substrate 18 can be the "first material" that defines the trench 12. In an exemplary embodiment, the first material 30 includes from about 30 to about 100 mass percent semiconductor material.

In some cases, the trench 12 may be defined by more than the first material 30. For example, the silicon on insulator substrate described above may include trench side surfaces 24 that are monocrystalline silicon (i.e., the "first material 30") and the trench bottom 22 may be the silicon dioxide buried oxide layer, such that the trench 12 is defined by the monocrystalline silicone first material 30 on the sides and by the buried oxide layer on the bottom. Silicon may be epitaxially grown overlying a monocrystalline substrate 18 by vapor phase epitaxy using silicon tetrachloride and hydrogen gas, but other types of epitaxy can also be used, such as molecular beam epitaxy. Conductivity determining ions of the desired type may be added to the source gas during the epitaxial growth, so the first material 30 is formed with the desired conductivity determining ions at the desired concentration. In the embodiment illustrated, the trenches 12 are formed between adjacent fins 32, where the fins 32 may be formed by conventional methods. In an exemplary embodiment, the fins 32 may be produced by forming a hard mask and a lithographic mask overlying the first material 30 (not illustrated), patterning the lithographic and hard mask using known techniques, and selectively etching the first material 30 to form the trenches 12 between adjacent fins 32. However, the fins 32 may be formed by other conventional methods in alternate embodiments.

Figure 2:
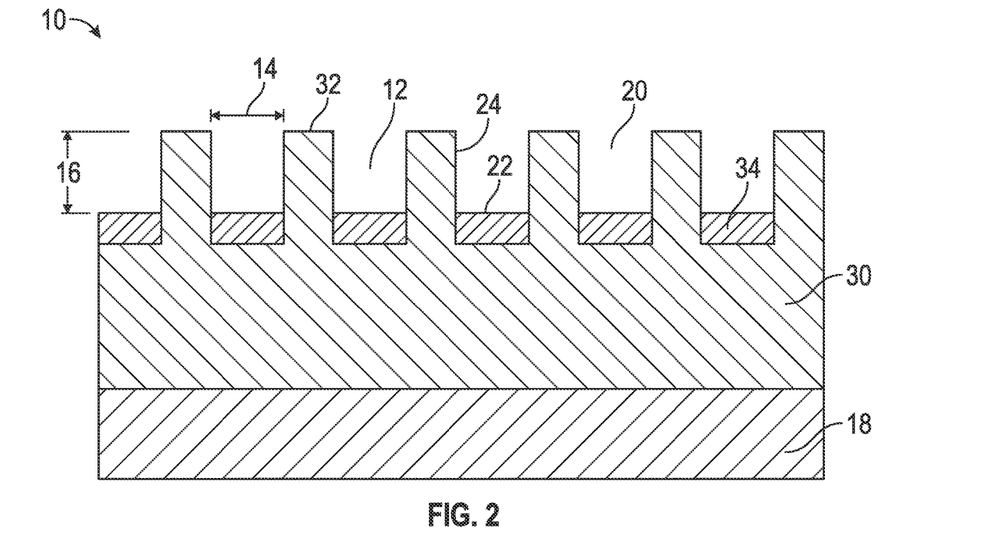
Figure 3:
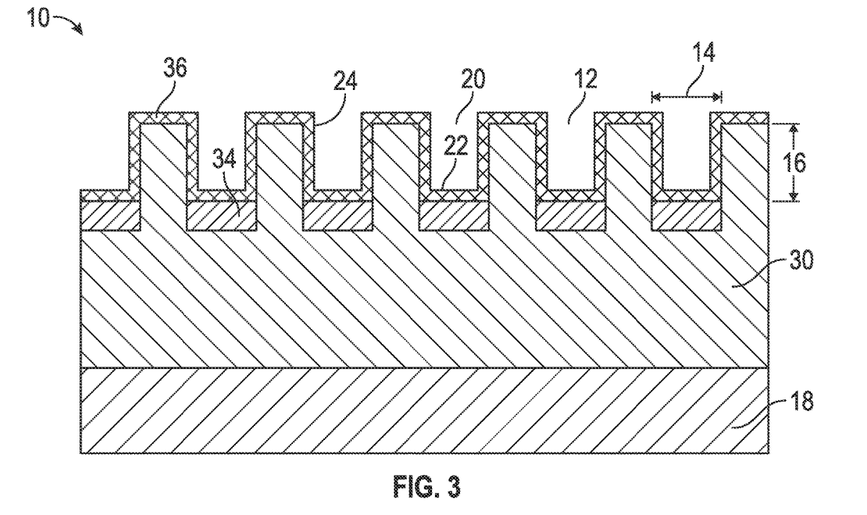

Referring to an embodiment illustrated in FIG. 2, an optional isolation dielectric 34 is formed in the trenches 12 between the adjacent fins 32. The isolation dielectric 34 may be silicon dioxide that is deposited over the tops of the fins 32 and in the trenches 20 by chemical vapor deposition using silane and oxygen. After deposition, the isolation dielectric 34 may be selectively recessed to a desired height, such as with a wet etch using dilute hydrofluoric acid, but other techniques may also be used. Referring to FIG. 3, a gate dielectric 36 is formed on the outer surfaces of the fins 32, and the gate dielectric 36 may overlie the optional isolation dielectric 34. The gate dielectric 36 may include silicon dioxide, which can be formed by chemical vapor deposition using silane and oxygen. The gate dielectric 36 and the isolation dielectric 34 form an insulating layer overlying the first material 30. In an alternate embodiment (not illustrated), no isolation dielectric 34 is formed. The gate dielectric 36 forms the trench bottom 22 after it is formed overlying the trench bottom 22. In each of the embodiments described above, the fins 32 and the trench bottom 22 are covered with a dielectric material.

Figure 4:
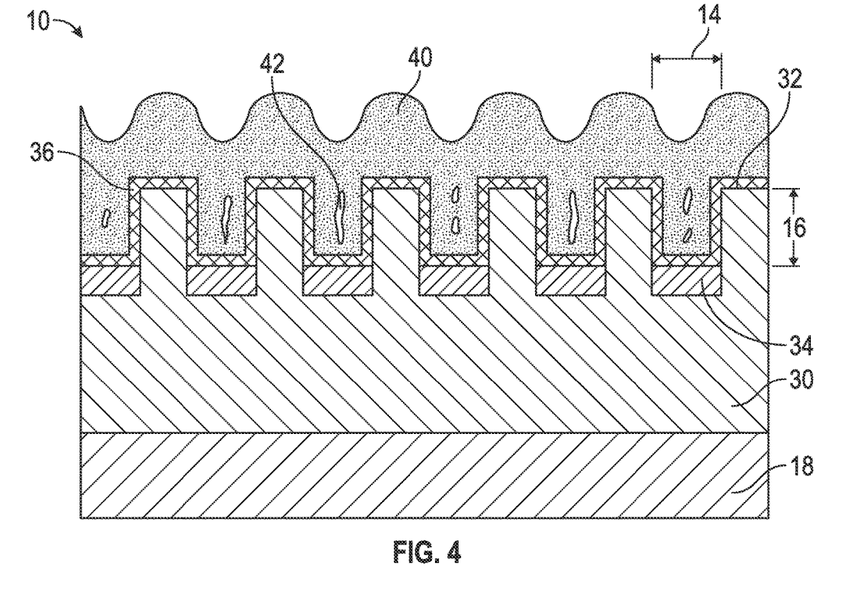

Reference is made to the embodiment illustrated in FIG. 4, with continuing reference to FIG. 3. A second material 40 is formed within the trench 12, and a gap 42 is formed within the second material 40 that is within the trench 12. In the example illustrated, the second material 40 includes amorphous silicon (a-Si), such as about 50 mass percent to about 100 mass percent amorphous silicon, which can be deposited by plasma enhanced chemical vapor deposition using silane. In an exemplary embodiment, the second material 40 is formed by a desublimation process, such as physical vapor deposition, chemical vapor deposition, atomic vapor deposition, or others. In a desublimation process, the second material 40 forms a solid from a gaseous phase. In some embodiments, the second material 40 is formed within the trench as a continuous material that does not include different compositions or different layers of the same material, but instead is one continuous, solid mass (other than the gap 42 therein). The second material 40 is formed overlying the first material 30, and also overlying the insulation layer (which is the isolation dielectric 34 and the gate dielectric 36 in the embodiment illustrated in FIGS. 3 and 4.) As such, the insulation layer is positioned between the first and second materials 30, 40. The second material 40 may be used as a "dummy gate" in some embodiments, where the second material 40 is eventually removed and replaced with a replacement gate. However, the integrated circuit 10 and methods described herein can be applied in many ways, so the second material 40 may include other materials or be used for other purposes in alternate embodiments.

Gaps 42 are commonly formed in amorphous silicon that is deposited by desublimation in trenches 12 that have a trench width 14 of about 30 nanometers or less, such as from about 1 to about 30 nanometers, or a trench width 14 of from about 1 to about 27 nanometers in another embodiment, especially if the trench 12 has an aspect ratio of 3 or greater. The gaps 42 may be enclosed within the fill material, or the gaps 42 may be open at the surface of the fill material in various embodiments. The aspect ratio is the trench depth 16 divided by the trench width 14, so a trench 12 with a trench width 14 of about 30 nanometers will have a trench depth of about 90 nanometers for an aspect ratio of 3. A trench width 14 of about 27 nanometers requires a trench depth 16 of about 81 nanometers to have an aspect ratio of about 3. Therefore, the trench width 14 is from about 1 to about 27 nanometers, or from about 1 to about 30 nanometers, and the trench depth 16 is from about 81 to about 500 nanometers, or from about 90 to about 500 nanometers in different embodiments. Amorphous silicon formed by a desublimation process may not include gaps 42 when deposited within trenches 12 with large trench widths 14, such as about 30 nanometers or larger, or about 40 nanometers or larger, or about 50 nanometers or larger in various embodiments. Amorphous silicon may also be formed without gaps 42 in trenches with a narrow trench width 14 if the aspect ratio is small enough, such as an aspect ratio of about 1 or less. However, gaps 42 are typically present in amorphous silicon formed by desublimation in trenches 12 with a trench width of about 30 or about 27 nanometers or less and an aspect ratio of about 3 or greater. Therefore, the break-point size of the trench 12 is about 27 to 30 nanometers with an aspect ratio of about 3 or greater. Other break-point sizes are also possible. For example, gaps 42 may be present in trenches 12 with a trench width 14 of more than 30 nanometers if the aspect ratio is greater than 3.

The size of the trench 12 does influence the formation of the gaps 42 within the second material 40. Materials other than amorphous silicon will also form gaps 42 when deposited using desublimation, and the dimensions of the trench 12 that result in gaps 42 may vary with the material being deposited, as well as the deposition technique and/or conditions.

Figure 5:
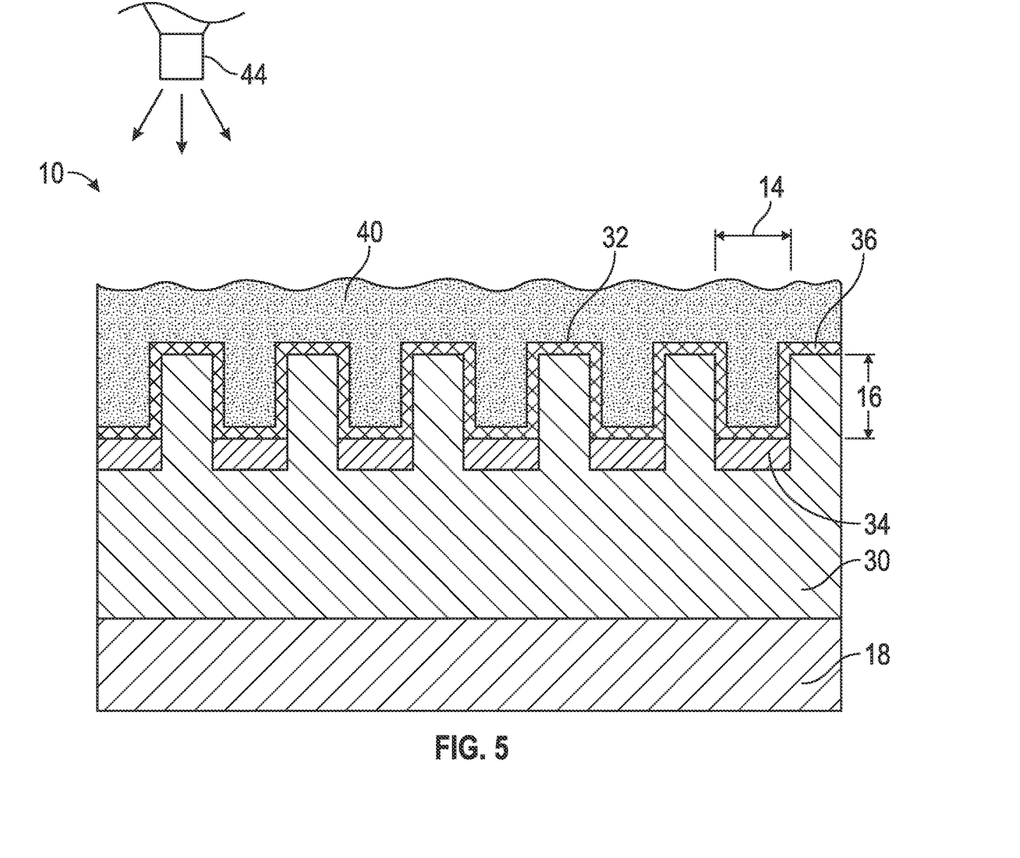

Referring to FIG. 5, with continuing reference to FIGS. 3 and 4, the second material 40 is reflowed such that the gaps 42 within the second material 40 are reduced in volume, including complete elimination of the gaps 42 in some embodiments. The term "free of gaps" or an "absence of gaps" as used herein means no gaps 42 are present that have a volume of 1 cubic angstrom or greater, so complete elimination of the gaps 42 means reducing the gaps 42 to a size of less than 1 cubic angstrom. In an exemplary embodiment, the second material 40 is reflowed by melting the second material 40 from a solid state to a liquid state. As used herein, a "solid state" is a state that has a definite shape and volume, where there is a phase transition between the solid state and a liquid state. A phase transition is a point where energy is transferred (when held at a constant temperature and pressure) to transition between the solid state and the liquid state. One example of a phase transition is the heat of crystallization required to transition water from a solid (water in the form of ice) to a liquid (water in a liquid form.) Some materials do not have a clearly defined crystalline transition point between the solid and liquid phase, but the materials do assume a solid-like state or a liquid-like state. Some refer to a glass transition, but the distinction between solid and liquid is generally not definitively established by a transition state. Therefore, for this description, a solid is also defined as a material with a viscosity of one billion centipoise or greater. A material in the liquid state, as opposed to the solid state, is a material that has about a constant volume but a variable shape, such that the liquid can flow. For the sake of clarity, a "liquid," as used herein, has a viscosity of less than one billion centipoise.

The second material 40 is reflowed, typically be the application of energy that is manifested in a temperature rise of the second material 40. In some embodiments, the second material 40 is liquefied and reflowed while the first material 30 is maintained in a solid state. As such, the temperature of the second material 40 is increased to above a second material melting point while the temperature of the first material 30 is maintained below a first material melting point. In an exemplary embodiment, the second material is heated for a brief period referred to as the reflow heating period, which is generally measured in nanoseconds, such as from about 20 to about 100 nanoseconds. The reflow heating period begins with the second material 40 at a pre-melt temperature below the second material melting point, and the reflow heating period ends from about 20 to about 100 nanoseconds later, or about 10 to about 200 nanoseconds later, or about 5 to about 1,000 nanoseconds later in various embodiments. The second material 40 is at a peak temperature above the second material melting point after the reflow heating period. The short reflow heating period facilitates heating of the second material 40 with limited heating of the first material 30 or many other components of the integrated circuit 10. In some embodiments, the insulating layer (which includes the isolation dielectric 34 and the gate dielectric 36 in the embodiment illustrated in FIGS. 3-5) insulates the first material 30 from the second material 40 so heat transfer from the second material 40 to the first material 30 is slowed.

In some embodiments, the first material melting point is higher than the second material melting point, so the second material 40 can be reflowed without melting or liquefying the first material based on the inherent melting points of the different materials. In the example illustrated in FIG. 5, the amorphous silicon in the second material 40 has a melting point of from about 1,120° C. to about 1,150° C., the silicon dioxide of the insulating layer (34 and 36) has a melting point of about 1,600° C., and the monocrystalline silicon of the first material 30 has a melting point of about 1,415° C. Therefore, heating of the second material 40 to from about 1,150° C. to about 1,480° C. will melt and reflow the second material 40 while maintaining the first material 30 below the first material melting point. In an alternate embodiment, the second material 40 could be heated to about 1,500 to about 1,600° C. to reflow and reduce or eliminate the gap 42, and then cooled, while the insulating layer (34 and 36) insulates and prevents the first material 30 from reaching the first material melting point. The thermal conductivity of silicon dioxide is relatively low, so the isolation dielectric 34 and the gate dielectric 36 (which form the insulating layer) serve to slow heat transfer from the second material 40 to the first material 30. The second material 40 may remain in the liquid state for longer than the reflow heating period, so the time for the second material 40 to reflow and fill in the gap 42 is longer than the reflow heating period in some embodiments.

In an exemplary embodiment, the second material 40 is heated for the reflow heating period with a heat producing device 44, such as a laser. The frequency and input energy of the laser can be adjusted to provide the proper amount of heat to reflow the second material 40, and a pre-heating device (not illustrated) may be employed to limit the required temperature increase during the reflow heating period to within a desired range. In one embodiment, the heat producing device 44 is an excimer laser with a wavelength of about 308 nanometers, and a fluence of about 2 joules per square centimeter (J/cm$^2$). In alternate embodiments, the wavelength of the laser, the fluence, and the dwell time may be adjusted to preferentially heat the second material 40 over the insulating layer and/or the first material 30, and/or other components of the integrated circuit 10. Dwell time refers to the amount of time that the laser spot is directed at a particular location. In yet another embodiment, the heat producing device 44 may be a microwave. In some embodiments, the frequency of the microwave can be tuned to preferentially heat the second material 40 over other materials, as described above for the laser. In some embodiments, the heat producing device 44 can deliver heat to a relatively small area, such as the spot size for a laser. The integrated circuit 10 may be formed from a disc (not illustrated), where the trench 12 is formed in a trench area of the disc (not illustrated). The heat producing device 44 may then be selectively directed to the trench area of the disc to reflow the second material 40 within the trench area of disc without heating other areas of the disc during the reflow heating period. The spot of the heat producing device 44 can then be scanned over any desired area of the disc. Heating of selected areas of the disc may be limited to a macro scale, such as about 1 square millimeter or more, in some embodiments.

After the second material 40 is liquefied and reflows, the secondary material 40 is cooled to below the secondary material melting point such that the secondary material 40 returns to a solid state. The morphology of the secondary material after re-solidification can be controlled, which can aid in future manufacturing steps or in the operation of the integrated circuit. The morphology of the second material 40 is referred to herein as pre-melt and post-melt, such as the pre-melt second material morphology before the reflow process, and the post-melt second material morphology after the reflow process. In an exemplary embodiment, the amorphous nature of silicon pre-melt is changed to polycrystalline silicon post-melt and the grain size of polycrystalline silicon can be adjusted by controlling the input energy of the heat producing device 44, and/or by controlling the temperature and cooling rate of the second material 40 as it is solidified. More energy used in the heat producing device 44 increases the peak temperature of the second material 40, which tends to produce smaller grains. A faster cooling rate for re-solidifying the second material 40 also tends to produce smaller grains. The cooling rate may be controlled by solidification temperature and dwell time, where the integrated circuit 10 is exposed to the solidification temperature after the reflow heating period. Higher solidification temperatures produce slower cooling rates than lower solidification temperatures, so the solidification temperature can help in controlling the post-melt second material morphology. As such, the post-melt second material morphology may have a smaller grain size than the pre-melt second material morphology, but other morphology properties may also be controlled so that the pre- and post-melt second material morphology varies in other manners. Amorphous or polycrystalline silicon with smaller grains tends to etch more consistently than amorphous silicon with larger grains, and may also have different properties such as thermal conductivity, electrical resistivity, density, etc. Controlling these properties can be useful, and the properties can be tuned for a desired use of the second material 40.

Another example of the process is illustrated in FIGS. 6-9. In this example, a shallow trench isolation structure is formed in a substrate, and gaps in the shallow trench isolation structure are removed by reflowing the material of the shallow trench isolation structure.

Figure 6:
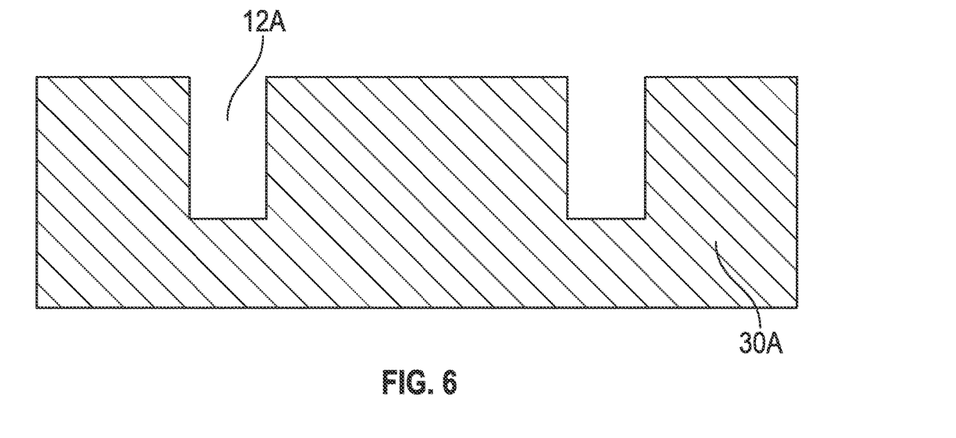
FIGS. 6-9 illustrate, in cross section, a portion of an alternate embodiment of an integrated circuit and methods for its fabrication in accordance with exemplary embodiments.

Referring now to the exemplary embodiment illustrated in FIG. 6, a trench 12A is formed in a first material 30A, where the first material 30A is a monocrystalline substrate, as described above. The trench 12A may be formed with a hard mask and lithography (not illustrated), as described above. The trench 12A may have similar dimension to the trench described above and illustrated in FIG. 1 as item 12. Referring now to the embodiment in FIG. 7 with continuing reference to FIG. 6, a second material 40A is formed in the trench 12A, such as by depositing silicon dioxide within the trench 12A and overlying the first material 30A. A gap 42A is formed within the second material 40A that is within the trench 12A. The second material 40A is formed by a desublimation process, such as chemical vapor deposition using silane and oxygen. As such, the second material 40A is formed in a solid state.

Figure 7:
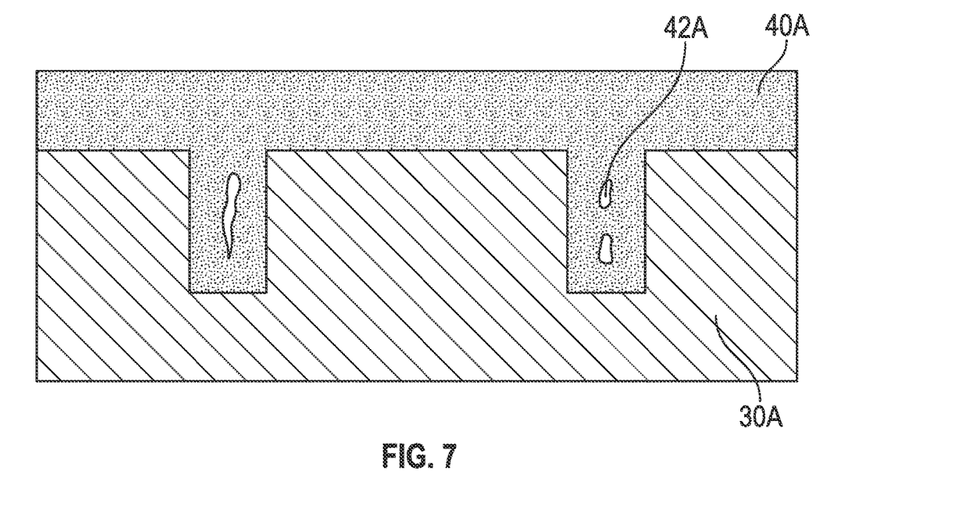
Figure 8:
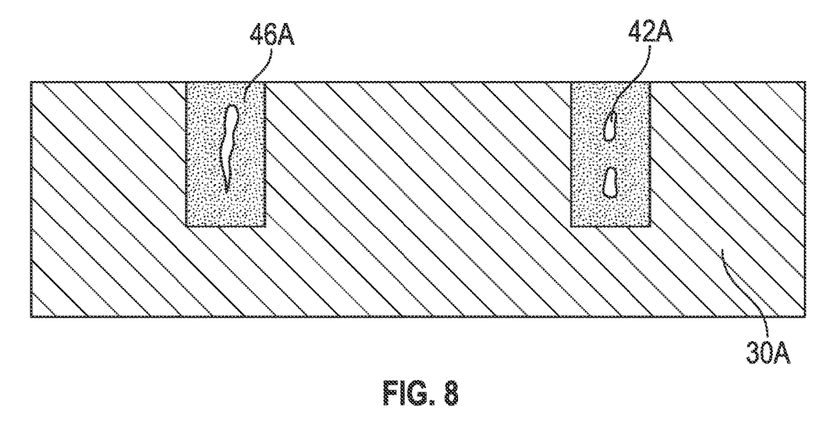
Figure 9:
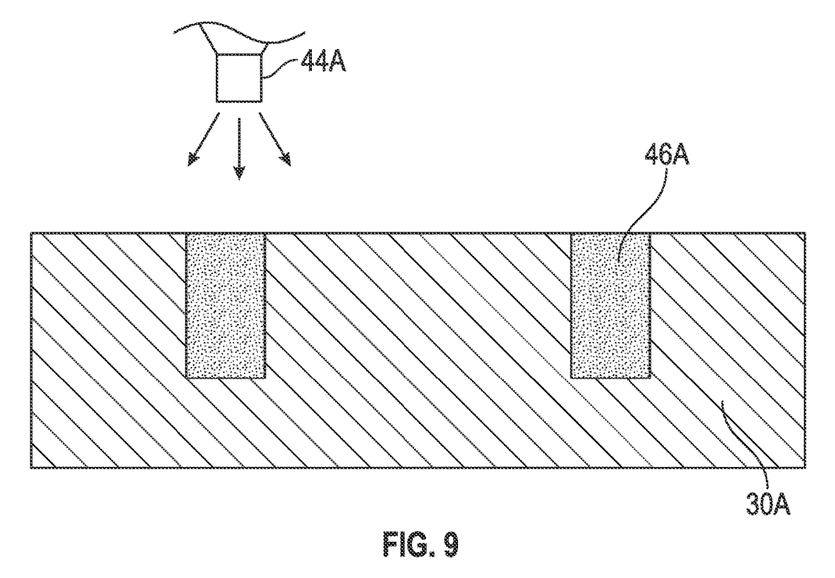

Referring now to FIG. 8 with continuing reference to FIGS. 6 and 7, the second material overburden overlying the first material 30A outside of the trench 12A is removed, such as by chemical mechanical planarization. The second material 40A remaining within the trench 12A is a shallow trench isolation structure 46A. A heat producing device 44A is used to melt and reflow the second material 40A of the shallow trench isolation structure 46A such that the gaps 42A are reduced in volume, as illustrated in FIG. 9 with continuing reference to FIGS. 6-8. The resulting shallow trench isolation structure 46A is free of gaps 42A in some embodiments. As described above, silicon dioxide has a higher melting point than monocrystalline silicon, so the monocrystalline silicon first material 30A (which is also the substrate in this example) melts more rapidly than the silicon dioxide within the shallow trench isolation structure 46A. However, the reflow heating period is short, so the shallow trench isolation structure 46A remains in essentially the same place before and after the shallow trench isolation structure 46A is melted and reflowed. The cooling period for re-solidifying the shallow trench isolation structure 46A can be controlled such that the molten silicon of the first material 30A reforms into a monocrystalline substrate. As such, in this embodiment, the first material 30A is brought to a temperature above the first material melting point while reflowing the second material 40A.

Many other embodiments are also possible, and the specific details described above may be modified in various manners. For example, a thermally conductive material could be used to direct heat to a sub-surface layer for a reflow process, or a conductive material may be used to direct heat to deep parts of the second material to better melt the second material while limiting temperature rise in other components. Materials that were deposited by processes other than desublimation processes could also be melted and reflowed.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the invention in any way. Rather, the foregoing detailed description will provide those skilled in the art with a convenient road map for implementing the exemplary embodiments. It should be understood that various changes can be made in the function and arrangement of elements without departing from the scope of the invention as set forth in the appended claims and the legal equivalents thereof.

What is claimed is:

1. A method of producing an integrated circuit comprising:
    forming a trench defined by a first material, wherein the trench comprises a trench bottom;
    forming an isolation dielectric overlying the trench bottom;
    forming a gate dielectric, wherein the gate dielectric overlies the isolation dielectric and the trench bottom;
    filling the trench with a second material after forming the gate dielectric to produce a gap defined within the second material, wherein the second material is in a solid state, and wherein the second material comprises amorphous silicon;
    reflowing the second material within the trench to reduce a volume of the gap, wherein reflowing the second material comprises converting the second material from the solid state to a liquid state; and
    solidifying the second material within the trench.

2. The method of claim 1 wherein:
    reflowing the second material comprises maintaining the first material at a first material temperature less than a first material melting point.

3. The method of claim 1 wherein:
    reflowing the second material comprises heating the second material with a heat producing device, wherein the heat producing device comprises a laser or a microwave.

4. The method of claim 1 further comprising:
    pre-heating the first and second materials before reflowing the second material.

5. The method of claim 1 wherein:
    reflowing the second material comprises heating the second material for a reflow heating period of from about 20 nanoseconds to about 100 nanoseconds to heat the second material from a pre-melt temperature less than a second material melting point to a peak temperature greater than the second material melting point.

6. The method of claim 1 wherein:
    forming the trench comprises forming the trench with a trench width of from about 1 to about 30 nanometers and a trench depth of from about 90 to about 500 nanometers.

7. The method of claim 1 further comprising:
    forming an insulating layer overlying the first material and underlying the second material.

8. The method of claim 7 wherein:
    forming the insulating layer comprises forming the insulating layer comprising silicon dioxide; and
    filling the trench comprises depositing amorphous silicon within the trench.

9. The method of claim 1 wherein:
    forming the trench comprises forming a plurality of fins, wherein the plurality of fins comprise a semiconductor material.

10. The method of claim 1 wherein:
    filling the trench comprises filling the trench with one continuous solid mass of second material.

11. The method of claim 1 wherein:
    filling the trench comprises depositing the second material by a desublimation process.

12. The method of claim 1 wherein:
    the isolation dielectric comprises silicon dioxide; and
    the gate dielectric comprises silicon dioxide.

13. A method of producing an integrated circuit comprising:
    forming a trench defined by a first material, wherein the trench comprises a trench bottom;
    forming an isolation dielectric overlying the trench bottom;
    forming a gate dielectric, wherein the gate dielectric overlies the isolation dielectric and the trench bottom;
    forming a second material within the trench after forming the gate dielectric, wherein the second material has a pre-melt second material morphology, wherein the second material is in a solid state, wherein the second material comprises amorphous silicon, and wherein the second material defines a gap within the trench;
    melting the second material such that the second material reflows and reduces a volume of the gap; and
    solidifying the second material within the trench, wherein the second material has a post-melt second material morphology that is different than the pre-melt second material morphology.

14. The method of claim 13 wherein:
    forming the second material comprises forming the second material wherein the second material comprises about 50 mass percent amorphous silicon or greater.

15. The method of claim 13 wherein:
    solidifying the second material comprises forming the post-melt second material morphology with a smaller grain size than the pre-melt second material morphology.

16. The method of claim 13 further comprising:
    controlling the post-melt second material morphology by controlling an energy input for melting the second material.

17. The method of claim 13 further comprising:
    controlling the post-melt second material morphology by controlling a solidification temperature.

18. The method of claim 13 wherein:
    forming the second material comprises depositing the second material by a desublimation process.

* * * * *